United States Patent
Mullick et al.

(10) Patent No.: US 10,622,221 B2
(45) Date of Patent: Apr. 14, 2020

(54) METHODS OF ETCHING METAL OXIDES WITH LESS ETCH RESIDUE

(71) Applicant: Applied Materials, Inc., Santa Clara, CA (US)

(72) Inventors: Amrita B. Mullick, Santa Clara, CA (US); Abhijit Basu Mallick, Palo Alto, CA (US); Srinivas Gandikota, Santa Clara, CA (US); Susmit Singha Roy, Sunnyvale, CA (US); Yingli Rao, Palo Alto, CA (US); Regina Freed, Los Altos, CA (US); Uday Mitra, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/219,328

(22) Filed: Dec. 13, 2018

(65) Prior Publication Data

US 2019/0189456 A1   Jun. 20, 2019

Related U.S. Application Data

(60) Provisional application No. 62/598,766, filed on Dec. 14, 2017.

(51) Int. Cl.
| | |
|---|---|
| *H01L 21/3213* | (2006.01) |
| *H01L 21/311* | (2006.01) |
| *H01L 21/02* | (2006.01) |
| *H01L 21/306* | (2006.01) |

(52) U.S. Cl.
CPC .. *H01L 21/32135* (2013.01); *H01L 21/02068* (2013.01); *H01L 21/306* (2013.01); *H01L 21/311* (2013.01); *H01L 21/31116* (2013.01); *H01L 21/31133* (2013.01); *H01L 21/3213* (2013.01)

(58) Field of Classification Search
None
See application file for complete search history.

(56) References Cited

U.S. PATENT DOCUMENTS

| | | |
|---|---|---|
| 8,101,025 B2 | 1/2012 | Lim et al. |
| 2017/0256416 A1 | 9/2017 | Fischer et al. |
| 2018/0130671 A1 | 5/2018 | Duan et al. |
| 2018/0350671 A1 | 12/2018 | Chen et al. |

FOREIGN PATENT DOCUMENTS

| | | |
|---|---|---|
| JP | 2000154007 A | 6/2000 |
| JP | 5437492 B2 | 3/2014 |
| WO | 2016172740 A1 | 10/2016 |
| WO | 2019036214 A1 | 2/2019 |
| WO | 2019050714 A1 | 3/2019 |
| WO | 2019055759 A1 | 3/2019 |

*Primary Examiner* — Jiong-Ping Lu
(74) *Attorney, Agent, or Firm* — Servilla Whitney LLC

(57) ABSTRACT

Processing methods to etch metal oxide films with less etch residue are described. The methods comprise etching a metal oxide film with a metal halide etchant, and exposing the etch residue to a reductant to remove the etch residue. Some embodiments relate to etching tungsten oxide films. Some embodiments utilize tungsten halides to etch metal oxide films. Some embodiments utilize hydrogen gas as a reductant to remove etch residues.

20 Claims, 1 Drawing Sheet

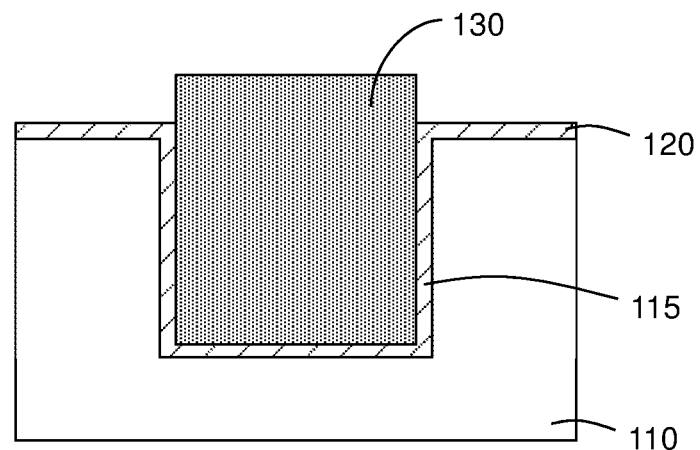
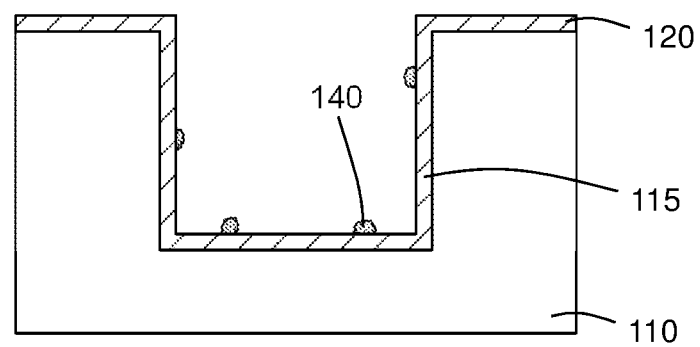
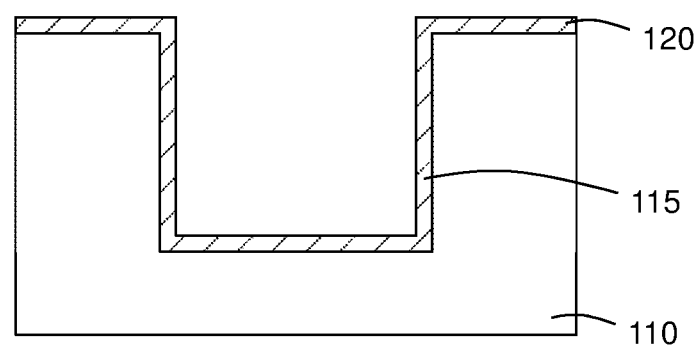

METHODS OF ETCHING METAL OXIDES WITH LESS ETCH RESIDUE

CROSS-REFERENCE TO RELATED APPLICATIONS

This application claims priority to U.S. Provisional Application No. 62/598,766, filed Dec. 14, 2017, the entire disclosure of which is hereby incorporated by reference herein.

TECHNICAL FIELD

The present disclosure relates generally to methods of etching oxidized metal films. In particular, the disclosure relates to processes for etching oxidized metal films that provide less etch residue.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another.

Creating high aspect ratio structures is one of the challenges in the field of device patterning. Many structures in logic and memory benefit from high aspect ratios. Several methods of forming high aspect ratio structure utilize the volumetric expansion of tungsten by oxidation to produce pillars of material around which other materials can be deposited. These tungsten containing pillars are later removed to provide high aspect ratio structures. These structures may later be filled with metallization contacts or other conductive materials.

However, the removal of these tungsten containing pillars often leaves an etch residue. This etch residue may decrease the available volume for any subsequently provided metallization layer and may increase the resistivity of these layers.

Therefore, there is a need in the art for methods of etching metal oxides which produce less etch residue.

SUMMARY

One or more embodiments of the disclosure are directed to a substrate processing method that comprises exposing a substrate comprising a oxidized metal layer to a metal halide to etch a portion of the oxidized metal layer and produce an etch residue. The substrate is exposed to a reductant to remove the etch residue.

Additional embodiments of the disclosure are directed to a substrate processing method comprising providing a substrate comprising a oxidized metal layer in a processing chamber with a processing volume. The substrate is exposed to a metal halide to remove a portion of the oxidized metal layer and produce an etch residue. The substrate is exposed to a reductant to remove the etch residue. Exposing the substrate to the metal halide and exposing the substrate to the reductant are repeated until a predetermined thickness of the oxidized metal layer has been removed.

Further embodiments of the disclosure are directed to a substrate processing method comprising providing a substrate comprising a $WO_3$ layer in a processing chamber with a processing volume. The substrate is exposed to a etchant comprising one or more of $WF_6$ or $WCl_5$ to remove a portion of the $WO_3$ layer and produce an etch residue. The processing volume is purged with an inert gas. The substrate is exposed to a reductant comprising $H_2$ to remove the etch residue. The processing volume is purged with an inert gas. Exposing the substrate to the etchant, purging the processing volume, exposing the substrate to the reductant and purging the processing volume are repeated until a predetermined thickness of the $WO_3$ layer has been removed.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE illustrates a processing method in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to substrate processing methods which etch or remove an oxidized metal layer from the substrate with less etch residue. Various embodiments of the disclosure are described with respect to a detailed process illustrated in the FIGURE.

With reference to the FIGURE, one or more embodiment of the disclosure is directed to a method 100 for etching an oxidized metal layer from a substrate which provide less etch residue. In some embodiments, the method is part of a larger process to form high aspect ratio structures.

In some embodiments, the substrate comprises a semiconductor material, e.g., silicon (Si), carbon (C), germanium (Ge), silicon germanium (SiGe), gallium arsenide (GaAs), InP, GaAs, InGaAs, InAlAs, other semiconductor material, or any combination thereof. In some embodiments, substrate is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate can be, for example, an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In some embodiments, the method 100 starts with providing a substrate 110 comprising an oxidized metal layer 130. In the embodiment shown in the FIGURE, the substrate 110 comprises a feature, a barrier layer 115 and an additional layer 120. The feature is lined with a barrier layer 115. The substrate surface outside the feature comprises an additional layer 120. In some embodiments, the additional layer comprises silicon dioxide. The substrate 110 illustrated in the FIGURE may be present in some embodiments, but for the purposes of this disclosure, the barrier layer 115 and the additional layer 120 are each optional.

In some embodiments, barrier layer 115 includes titanium nitride (TiN), titanium (Ti), tantalum (Ta), tantalum nitride (TaN), or any combination thereof. In another embodiment, the barrier layer 115 is an oxide, e.g., aluminum oxide (AlO), titanium oxide ($TiO_2$). In yet another embodiment, the barrier layer 115 is a nitride, e.g., silicon nitride (SiN). In some embodiments, the barrier layer 115 has a thickness from about 0.5 nm to about 10 nm.

In some embodiments, the method further comprises oxidizing a metal layer within the feature to produce the oxidized metal layer 130. In some embodiments, the additional layer 120 is formed as a result of the oxidation process used on the metal layer. Suitable metal layers include, but are not limited to, films including one or more of Co, Mo, W, Ta, Ti, Ru, rhodium (Rh), Cu, Fe, Mn, V, Niobium (Nb), hafnium (Hf), Zirconium (Zr), Yttrium (Y), Al, Sn, Cr, Lanthanum (La), or any combination thereof.

The barrier layer 115, the additional layer 120 and/or the oxidized metal layer 130 can be formed by any suitable technique known to the skilled artisan. Suitable techniques include, but are not limited to, chemical vapor deposition (CVD), atomic layer deposition (ALD), plasma enhanced CVD, plasma enhanced ALD and physical vapor deposition (PVD). The skilled artisan will be familiar with the various deposition processes and techniques and further description of these processes is not included.

The oxidized metal layer may be any suitable layer comprised of any suitable material. In some embodiments, the metal of the oxidized metal layer is selected from one or more of alkali metals, alkaline earth metals, transition metals, lanthanoids, actinoids and post-transition metals. In some embodiments, the oxidized metal layer comprises tungsten (W). The oxidized metal layer refers to a metal layer wherein the average oxidation state of the metal species is greater than 0. For the purposes of this disclosure, an oxidized metal layer may or may not contain oxygen.

In some embodiments, the oxidized metal layer has an average oxidation state less than the average oxidation state of a stoichiometric metal oxide. As used in this regard, a stoichiometric metal oxide refers to a fully oxidized metal oxide. For example, $WO_3$ and $Al_2O_3$ are both stoichiometric metal oxides. In some embodiments, the oxidized metal layer comprises a stoichiometric metal oxide. In some embodiments, the oxidized metal layer comprises $WO_3$.

In some embodiments, the oxidized metal layer comprises a sub-stoichiometric metal oxide. For the purposes of this disclosure, a sub-stoichiometric metal oxide is an oxidized metal layer where the ratio of metal to oxygen is greater than the ratio of metal to oxygen in the stoichiometric metal oxide of the same metal. For example, in some embodiments, the oxidized metal layer comprises a sub-stoichiometric metal oxide $WO_x$, where x is less than 3. Without limiting the metal species, in some embodiments, the oxidized metal layer comprises a sub-stoichiometric metal oxide.

The oxidized metal layer may comprise elements other than oxygen. In some embodiments, the oxidized metal layer comprises substantially no oxygen. As used in this regard, "comprises substantially no oxygen" means that the oxidized metal layer comprises less than 5%, 3%, 2%, 1% or 0.5% of oxygen on an atomic basis. In some embodiments, the oxidized metal layer comprises one or more of N, Si, or C. In some embodiments, the oxidized metal layer consists essentially of a metal nitride. In some embodiments, the oxidized metal layer consists essentially of a metal silicide.

Referring again to the FIGURE, the substrate 110 is exposed to a metal halide to etch or remove a portion of the oxidized metal layer 130 and produce an etch residue 140. In some embodiments, the metal halide etches or removes a portion of the barrier layer 115. Without being bound by theory, the inventors have found that attempting to etch metal oxide layers with metal halides does not remove 100% of the metal oxide layer, but rather leaves an etch residue. The inventors believe that the etch residue may result from the incomplete removal of the oxidized metal layer or the conversion of the oxidized metal layer into a non-volatile species.

The metal halide may be any suitable compound consisting of at least one metal and at least one halogen. The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. In some embodiments, the oxidized metal layer and the metal halide comprise the same metal species. In some embodiments, the oxidized metal layer and the metal halide comprise different metal species. In some embodiments, the metal halide comprises tungsten (W).

In some embodiments, the metal halogen comprises one or more of fluorine (F), chlorine (Cl), bromine (Br) or iodine (I). In some embodiments, the metal halide comprises one or more of $WF_6$ or $WCl_5$. In some embodiments, the metal halide consists essentially of $WF_6$. In some embodiments, the metal halide consists essentially of $WCl_5$. As used in this regard, "consists essentially of" means the metal halide is greater than 95%, 98%, 99% or 99.5% of the stated species on a molar basis.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

Referring again to the FIGURE, the substrate 110 is exposed to a reductant to remove the etch residue. The reductant can be any compound capable of removing the etch residue. In some embodiments, the reductant comprises one or more of $H_2$, $B_2H_6$ or $BCl_3$. In some embodiments, the reductant consists essentially of one of $H_2$, $B_2H_6$ or $BCl_3$. As used in this regard, "consists essentially of" means the reductant is greater than 95%, 98%, 99% or 99.5% of the stated species on a molar basis, not including any carrier gas or diluent gas.

The metal halide and/or the reductant may be exposed to the substrate with a carrier gas or diluent gas. Suitable carrier or diluent gases include, without limitation, Ar, $N_2$, He, Ne, Kr, Xe and mixtures thereof.

Exposure of the substrate to the metal halide and the reductant can be referred to as one cycle. In some embodiments, the method comprises multiple cycles. Stated differently, in some embodiments, the method further comprises repeating the exposure to the metal halide and exposure to the reductant. In some embodiments, the exposure to the metal halide and exposure to the reductant is repeated until a predetermined thickness of the oxidized metal layer has been removed.

The conditions under which the method is performed can also be controlled. Controllable conditions include, but are not limited to, temperature, pressure, exposure times, flow rates and purge times.

In some embodiments, the methods of the disclosure are performed at pressures less than or equal to about 40 Torr, less than or equal to about 30 Torr, less than or equal to about 20 Torr, less than or equal to about 10 Torr, or less than or equal to about 5 Torr. In some embodiments, the methods of the disclosure are performed at pressures greater than or equal to about 5 Torr, greater than or equal to about 10 Torr, greater than or equal to about 15 Torr, greater than or equal to about 20 Torr, or greater than or equal to about 30 Torr.

The substrate processing methods of this disclosure may be performed at any suitable temperature. In some embodiments, the substrate is maintained at a temperature less than or equal to about 475° C., less than or equal to about 450° C., less than or equal to about 400° C., less than or equal to about 350° C., or less than or equal to about 300° C. In some embodiments, the substrate is maintained at a temperature greater than or equal to about 200° C., greater than or equal to about 250° C., greater than or equal to about 300° C., or greater than or equal to about 350° C.

In some embodiments, the substrate is provided in a processing chamber with a processing volume. In some embodiments, the methods of the disclosure comprise purging the processing volume after exposing the substrate to the metal halide and purging the processing volume after exposing the substrate to the reductant. The processing volume may be purged with any suitable inert gas. Examples of inert gasses include, without limitation, those gasses listed as carrier gas or diluent gas.

Reference throughout this specification to "some embodiments," "certain embodiments," "one or more embodiments" or "an embodiment" means that a particular feature, structure, material, or characteristic described in connection with the embodiment is included in some embodiments of the disclosure. Thus, the appearances of the phrases such as "in one or more embodiments," "in certain embodiments," "in some embodiments" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the methods of the present disclosure without departing from the spirit and scope of the disclosure. Thus, it is intended that the present disclosure include modifications and variations that are within the scope of the appended claims and their equivalents.

What is claimed is:

1. A substrate processing method comprising:
   exposing a substrate comprising an oxidized metal layer to a metal halide to etch a portion of the oxidized metal layer and produce an etch residue; and
   exposing the substrate to a reductant to remove the etch residue.

2. The method of claim 1, wherein an average oxidation state of the oxidized metal layer is less than an average oxidation state of a stoichiometric metal oxide.

3. The method of claim 2, wherein the oxidized metal layer comprises a sub-stoichiometric metal oxide.

4. The method of claim 2, wherein the metal oxide comprises one or more of N, Si, or C.

5. The method of claim 1, wherein the oxidized metal layer and the metal halide comprise the same metal species.

6. The method of claim 1, wherein the oxidized metal layer comprises tungsten (W).

7. The method of claim 1, wherein the metal halide comprises tungsten (W).

8. The method of claim 7, wherein the metal halide consists essentially of $WF_6$.

9. The method of claim 7, wherein the metal halide consists essentially of $WCl_5$.

10. The method of claim 1, wherein the reductant comprises one or more of $H_2$, $B_2H_6$ or $BCl_3$.

11. The method of claim 1, further comprising repeating the exposure to the metal halide and exposure to the reductant.

12. The method of claim 1, wherein the substrate processing method is performed at a pressure of greater than or equal to about 5 torr.

13. The method of claim 1, wherein the substrate is maintained at a temperature of less than or equal to about 400° C.

14. A substrate processing method comprising:
(A) providing a substrate comprising an oxidized metal layer in a processing chamber with a processing volume;
(B) exposing the substrate to a metal halide to remove a portion of the oxidized metal layer and produce an etch residue;
(C) exposing the substrate to a reductant to remove the etch residue; and
(D) repeating (B) and (C) until a predetermined thickness of the oxidized metal layer has been removed.

15. The method of claim 14, further comprising purging the processing volume after exposing the substrate to the metal halide and purging the processing volume after exposing the substrate to the reductant.

16. The method of claim 14, wherein an average oxidation state of the oxidized metal layer is less than an average oxidation state of a stoichiometric metal oxide.

17. The method of claim 14, wherein the oxidized metal layer comprises $WO_3$.

18. The method of claim 14, wherein the metal halide comprises one or more of $WF_6$ or $WCl_5$.

19. The method of claim 14, wherein the reductant comprises one or more of $H_2$, $B_2H_6$ or $BCl_3$.

20. A substrate processing method comprising:
(A) providing a substrate comprising a $WO_3$ layer in a processing chamber with a processing volume;
(B) exposing the substrate to a etchant comprising one or more of $WF_6$ or $WCl_5$ to remove a portion of the $WO_3$ layer and produce an etch residue;
(C) purging the processing volume with an inert gas;
(D) exposing the substrate to a reductant comprising $H_2$ to remove the etch residue;
(E) purging the processing volume with an inert gas; and
(F) repeating (B) through (E) until a predetermined thickness of the $WO_3$ layer has been removed.

* * * * *